United States Patent
Baum et al.

(10) Patent No.: US 9,021,334 B2
(45) Date of Patent: Apr. 28, 2015

(54) CALCULATION OF ANALOG MEMORY CELL READOUT PARAMETERS USING CODE WORDS STORED OVER MULTIPLE MEMORY DIES

(71) Applicant: Apple Inc., Cupertino, CA (US)

(72) Inventors: Barak Baum, Givatayim (IL); Tomer Ish-Shalom, Raanana (IL); Micha Anholt, Tel Aviv (IL); Eyal Gurgi, Petah-Tikva (IL); Yoav Kasorla, Kfar Netar (IL)

(73) Assignee: Apple Inc., Cupertino, CA (US)

( * ) Notice: Subject to any disclaimer, the term of this patent is extended or adjusted under 35 U.S.C. 154(b) by 128 days.

(21) Appl. No.: 13/874,995

(22) Filed: May 1, 2013

(65) Prior Publication Data

US 2014/0331106 A1 Nov. 6, 2014

(51) Int. Cl.
*G11C 29/00* (2006.01)
*G06F 11/10* (2006.01)

(52) U.S. Cl.
CPC ............ *G06F 11/10* (2013.01); *G06F 11/1076* (2013.01)

(58) Field of Classification Search
None
See application file for complete search history.

(56) References Cited

U.S. PATENT DOCUMENTS

| | | | |
|---|---|---|---|
| 6,715,036 B1 * | 3/2004 | Burton et al. | 711/118 |
| 6,804,799 B2 * | 10/2004 | Zuraski, Jr. | 714/54 |
| 7,774,684 B2 * | 8/2010 | Bains | 714/766 |
| 8,060,774 B2 * | 11/2011 | Smith et al. | 714/5.11 |
| 8,156,398 B2 | 4/2012 | Sommer | |
| 8,370,709 B2 * | 2/2013 | Ware | 714/763 |
| 8,495,465 B1 * | 7/2013 | Anholt et al. | 714/763 |
| 8,773,905 B1 * | 7/2014 | Radinski et al. | 365/185.03 |
| 8,788,922 B2 * | 7/2014 | Anholt et al. | 714/801 |
| 2006/0107130 A1 * | 5/2006 | Baker et al. | 714/710 |
| 2011/0161775 A1 | 6/2011 | Weingarten | |

OTHER PUBLICATIONS

Ravi Motwani, Chong Ong, "Digital Signal Processing for High Endurance SSDs" Inter Corporation, Santa Clara, CA, Mar. 5, 2013, pp. 1-28.

* cited by examiner

*Primary Examiner* — Daniel McMahon
(74) *Attorney, Agent, or Firm* — Meyertons, Hood, Kivlin, Kowert & Goetzel, P.C.

(57) ABSTRACT

A method includes, in a memory that includes two or more memory units, storing a code word of an Error Correction Code (ECC) that is representable by a plurality of check equations, such that a first part of the code word is stored in a first memory unit and a second part of the code word is stored in a second memory unit. A subset of the check equations, which operate only on code word bits belonging to the first part stored in the first memory unit, is identified. The first part of the code word is retrieved from the first memory unit, and a count of the check equations in the identified subset that are not satisfied by the retrieved first part of the code word is evaluated. One or more readout parameters, for readout from the first memory unit, are set depending on the evaluated count.

18 Claims, 3 Drawing Sheets

CALCULATION OF ANALOG MEMORY CELL READOUT PARAMETERS USING CODE WORDS STORED OVER MULTIPLE MEMORY DIES

FIELD OF THE INVENTION

The present invention relates generally to memory devices, and particularly to methods and systems for setting thresholds for reading analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as analog storage values or analog values. In Flash memories, for example, each analog memory cell holds a certain amount of electrical charge. The range of possible analog values is typically divided into regions, each region corresponding to a programming state or programming level that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Various techniques for setting read thresholds and other read parameters for reading analog memory cells are known in the art. For example, U.S. Pat. No. 8,156,398, whose disclosure is incorporated herein by reference, describes a method for operating a memory that includes analog memory cells. The method includes encoding data with an Error Correction Code (ECC) that is representable by a plurality of equations. The encoded data is stored in a group of the analog memory cells by writing respective input storage values to the memory cells in the group. Multiple sets of output storage values are read from the memory cells in the group using one or more different, respective read parameters for each set. Numbers of the equations, which are satisfied by the respective sets of the output storage values, are determined. A preferred setting of the read parameters is identified responsively to the respective numbers of the satisfied equations. The memory is operated on using the preferred setting of the read parameters.

SUMMARY OF THE INVENTION

An embodiment of the present invention that is described herein provides a method in a memory that includes two or more memory units. The method includes storing a code word of an Error Correction Code (ECC) that is representable by a plurality of check equations, such that a first part of the code word is stored in a first memory unit and a second part of the code word is stored in a second memory unit. A subset of the check equations, which operate only on code word bits belonging to the first part stored in the first memory unit, is identified. The first part of the code word is retrieved from the first memory unit, and a count of the check equations in the identified subset that are not satisfied by the retrieved first part of the code word is evaluated. One or more readout parameters, for readout from the first memory unit, are set depending on the evaluated count.

In some embodiments, the memory units include memory dies. In an embodiment, setting the readout parameters includes setting one or more read thresholds used for readout from the first memory unit. In a disclosed embodiment, a check matrix of the ECC includes regions of all-zero elements that define the subset of the check equations. In another embodiment, evaluating the count of the check equations includes computing the count over multiple first parts, which belong to multiple respective code words and are retrieved from the first memory unit.

In some embodiments, the method includes identifying a second subset of the check equations, which operate only on the code word bits belonging to the second part stored in the second memory unit, retrieving the second part of the code word from the second memory unit, evaluating a second count of the check equations in the identified second subset that are not satisfied by the retrieved second part of the code word, and setting the readout parameters for the second memory unit, different from the readout parameters set for the first memory unit, depending on the evaluated second count.

In an embodiment, the method includes decoding the ECC over only the first part using the check equations in the subset. In another embodiment, the readout parameters includes cross-coupling coefficients, and setting the readout parameters includes canceling, using the cross-coupling coefficients, cross-coupling interference among memory cells in the first memory unit that store the first part.

In yet another embodiment, the readout parameters include a time that elapsed since the first part was stored in the first memory unit. In still another embodiment, the readout parameters include a statistical property of a noise that distorts the first part retrieved from the first memory unit. In an embodiment, the ECC includes a Low Density Parity Check (LDPC) code. Alternatively, the ECC includes a terminated convolutional code.

There is additionally provided, in accordance with an embodiment of the present invention, apparatus including a memory and storage circuitry. The memory includes two or more memory units. The storage circuitry is configured to store a code word of an Error Correction Code (ECC) that is representable by a plurality of check equations, such that a first part of the code word is stored in a first memory unit and a second part of the code word is stored in a second memory unit, to identify a subset of the check equations that operate only on code word bits belonging to the first part stored in the first memory unit, to retrieve the first part of the code word from the first memory unit, to evaluate a count of the check equations in the identified subset that are not satisfied by the retrieved first part of the code word, and to set one or more readout parameters for readout from the first memory unit depending on the evaluated count.

There is also provided, in accordance with an embodiment of the present invention, apparatus including an interface and storage circuitry. The interface is configured to communicate with a memory including two or more memory units. The storage circuitry is configured to store a code word of an Error Correction Code (ECC) that is representable by a plurality of check equations, such that a first part of the code word is stored in a first memory unit and a second part of the code word is stored in a second memory unit, to identify a subset of the check equations that operate only on code word bits belonging to the first part stored in the first memory unit, to retrieve the first part of the code word from the first memory unit, to evaluate a count of the check equations in the identified subset that are not satisfied by the retrieved first part of the code word, and to set one or more readout parameters for readout from the first memory unit depending on the evaluated count.

The present invention will be more fully understood from the following detailed description of the embodiments thereof, taken together with the drawings in which:

DETAILED DESCRIPTION OF EMBODIMENTS

Overview

Figure 1:
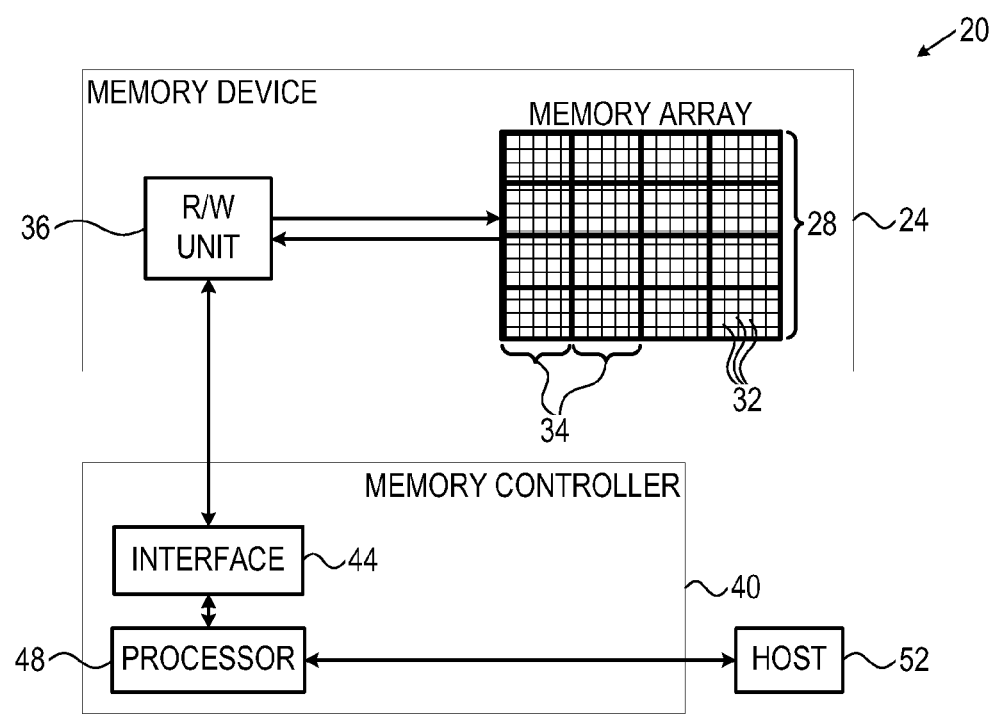
FIG. 1 is a block diagram that schematically illustrates a memory system, in accordance with an embodiment of the present invention.

Embodiments of the present invention that are described herein provide improved methods and systems for calculating read thresholds and other readout parameters, for use in reading data from analog memory cells. In some embodiments, a memory controller encodes data with an Error Correction Code (ECC) so as to produce code words, divides a given code word into multiple parts and stores each part on a different memory die. This technique is useful, for example, for increasing the storage and retrieval throughput, because different dies can usually be programmed and read in parallel.

The ECC used for encoding the data can be represented by a set of check equations. In some embodiments the memory controller estimates the quality with which a code word is retrieved from memory by evaluating a "syndrome sum," which is defined as the number of check equations that are not satisfied by the retrieved code word. The memory controller may use the syndrome sum, for example, as a quality measure for setting read thresholds.

When the bits of each code word are distributed over multiple dies, however, the syndrome sum (which is computed over the entire code word) may not reflect the readout quality from any specific die. As such, setting read thresholds for a given die based on the syndrome sum of the entire code word may be erroneous or at least sub-optimal.

In some embodiments, instead of calculating the syndrome sum over the entire code word, the memory controller computes the read thresholds for a given die based on a die-specific syndrome sum. The die-specific syndrome sum of a given die is defined as the number of non-satisfied check equations, computed over a subset of the check equations that operate only on code-word bits stored on that die. Typically, the memory controller identifies the subset of equations corresponding to a given die, calculates the die-specific syndrome sum over the equations in the subset, and assesses the readout quality depending on the die-specific syndrome sum. The optimal read thresholds for a given die can be found based on the die-specific syndrome sum, e.g., by minimizing the die-specific syndrome sum.

In an arbitrary ECC, many of the check equations will typically involve bits from more than one die. In such a code, the number of equations in each of the above-defined subsets will typically be small, and the die-specific syndrome sum estimation may be inaccurate. In some embodiments, the memory controller uses an ECC that is designed so as to enable accurate die-specific syndrome sum estimation. In such a code, the check equations comprise large distinct subsets of equations, which operate on the bits of different dies. Methods for designing parity check matrices that meet this criterion are described herein.

In some embodiments, the memory controller increases the read threshold estimation accuracy, by averaging or summing die-specific syndrome sums over corresponding parts of multiple code words. In some embodiments, the memory controller attempts to decode the part of a code word read from a given die, based on the subset of check equations corresponding to that die. If the attempt fails, the memory controller typically decodes the entire code word from all dies, using all available check equations of the code. Additionally or alternatively to read threshold estimation, the techniques described herein can be used for estimating other readout parameters, such as cross-coupling interference coefficients.

In summary, the methods and systems described herein enable the memory controller to use syndrome-sum quality measure, which are particularly effective in harsh conditions in which ECC decoding fails, without compromising the ability to split code words over multiple dies.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in at least one memory cell array 28. Each memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

For each array 28, memory device 24 comprises a respective reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. Additionally or alternatively, each memory device 24 may comprise multiple arrays 28, e.g., on separate semiconductor dies. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes several example techniques for selecting and adapting read thresholds for reading the data stored in memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W circuitry in any suitable manner, or performed by any one of these elements. Thus, in the context of the present patent application and in the claims, memory controller 40 and R/W circuitry 36 are referred to jointly as storage circuitry that carries out the disclosed techniques.

Storing ECC Code Words Over Multiple Dies

In some embodiments, memory controller 40 encodes data for storage with an Error Correction Code (ECC), divides each ECC code word into multiple parts, and stores each part on a different die. For example, memory device 24 may comprise multiple memory dies in the same package. As another example, different memory dies may reside in different memory devices. Distributing a code word across multiple dies is useful, for example, to reduce programming and readout latency and increase throughput, because different dies can typically be programmed and/or read in parallel.

Figure 2:
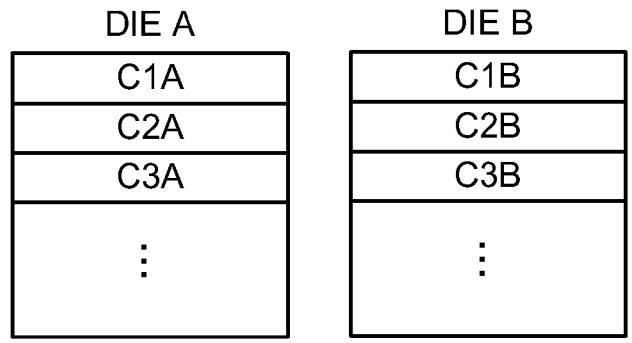
FIG. 2 is a diagram showing code words partitioned between memory dies, in accordance with an embodiment of the present invention.

FIG. 2 is a diagram showing code words partitioned between memory dies, in accordance with an embodiment of the present invention. In the present example, the memory controller stores multiple code words denoted C1, C2, C3, ... on two dies denoted DIE A and DIE B. Each code word is split into two parts: C1 into C1A and C1B, C2 into C2A and C2B, and so on. The two parts of each code word are stored on the two dies, respectively.

In the present example, the code word size is 4K bits, and the code word is split into two equal parts such that 2K bits are stored on each die. In alternative embodiments, any other suitable code word size and partitioning can be used.

The storage configuration of FIG. 2 is chosen purely by way of example. In alternative embodiments, ECC code words may be partitioned in any other suitable way over any desired number of dies. Although the embodiments described herein refer mainly to memory dies, the disclosed techniques can be used in a similar manner, and provide similar benefits, with ECC code words that are partitioned among other types of memory units, such as planes, blocks or memory devices, as well as different pages (corresponding to different significance bits) in a given word line or other group of memory cells.

Memory controller 40 may encode the data using any suitable ECC, such as a Low Density Parity Check (LDPC), a Bose-Chaudhuri-Hocquenghem (BCH) code, a Reed-Solomon (RS) code or a terminated convolutional code. In some embodiments, The ECC used by memory controller 40 is defined by a set of check equations. In the case of a binary ECC such as LDPC, the equations comprise parity check equations. The embodiments described herein refer mainly to LDPC and parity check equations, but the disclosed techniques can be used in a similar manner with non-binary codes such as RS.

Typically, each parity check equation defines an eXclusive OR (XOR) operation among a selected subset of the encoded bits in the code word. The equation is satisfied if and only if the XOR result is "0". The parity check equations are commonly arranged in a matrix, which is referred to as a parity check matrix. Parity check matrices are described, for example, by Blahut in "Theory and Practice of Error Control Codes," Addison-Wesley, May, 1984, section 3.2, pages 47-48, which is incorporated herein by reference.

Read Threshold Setting for Code Words Stored Over Multiple Dies

When reading a code word from memory device 24, the number of parity check equations that are satisfied by the readout results (or the complementary number, i.e., the number of equations that are not satisfied) is typically indicative of the readout quality. The number of non-satisfied parity check equations is referred to herein as "syndrome sum."

If all equations are satisfied (meaning that ECC decoding is successful such that the syndrome sum is zero) readout quality was good. Even when the ECC cannot be decoded successfully, the syndrome sum is typically a valid indication of the readout quality.

For example, if the read thresholds are positioned at a sub-optimal position, the syndrome sum is often a good indicator of the deviation of the read thresholds from the optimal position. One important advantage of this indication is that the syndrome sum is a valid indication of read threshold quality even under harsh conditions that prevent successful decoding of the ECC.

The description that follows focuses mainly on read threshold setting. As will be explained further below, the syndrome sum may also be used as an indication of other readout parameters. Certain aspects of using the syndrome sum for readout parameter estimation are addressed in U.S. Pat. No. 8,156,398, cited above.

When using multiple dies, the optimal read threshold positions may vary from one die to another. These variations may be caused, for example, by different operating conditions of different dies, or for any other reason. When an ECC code word is divided and stored on multiple dies, the overall syndrome sum computed over the entire code word may not reflect the true readout quality on each die. For example, it may be difficult or impossible to set the read thresholds for a given die based on this syndrome sum.

Thus, in some embodiments memory controller 40 sets the read thresholds for a given die based on a die-specific syndrome sum. The die-specific syndrome sum is computed over the parity check equations that operate only on bits that are stored on that die. Typically, the memory controller identifies the subset of parity check equations that operate only on bits read from the given die, assesses the number of parity check equations within the subset that are satisfied by the readout results from the given die, and sets the read thresholds for the given die depending on this number. A similar process may be performed per die, using different parts of the same code word, possibly resulting in different threshold settings for different dies.

For an arbitrary ECC, which is not designed specifically for use with die-specific syndrome sums, there is no guarantee that the parity check equations are separable into subsets in this manner. In other words, it is possible that only a small number of equations operate only on bits read from a specific die. In such a case, the die-specific syndrome sum may not perform well.

Thus, in some embodiments (although not necessarily) memory controller 40 uses an ECC whose parity check equations are designed for providing high-quality die-specific syndrome sum. In such a code, there is good separation (although not necessarily perfect) between subsets of equations that operate on bits stored on different dies.

Figure 3:
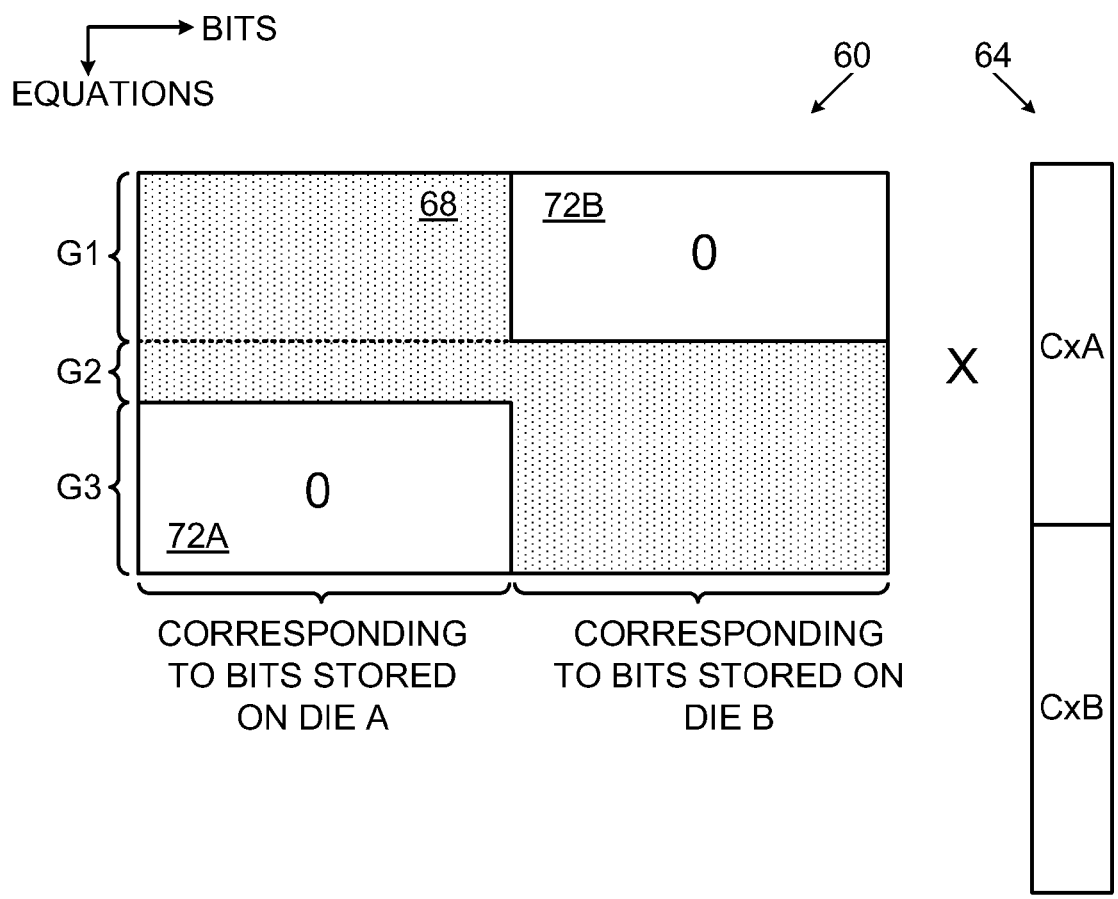
FIG. 3 is a diagram showing a parity check matrix of an Error Correction Code (ECC), in accordance with an embodiment of the present invention.

FIG. 3 is a diagram showing an ECC parity check matrix 60 operating on an n-bit vector 64, in accordance with an embodiment of the present invention. Each row of matrix 60 corresponds to a respective parity check equation, and each column of the matrix corresponds to a respective bit in the code word.

In the present example, vector 64 comprises the readout results of a code word, which is made-up of two parts CxA and CxB stored on DIE A and DIE B, respectively. The left-hand-side columns correspond to the CxA bits stored on DIE A, and the right-hand-side columns correspond to the CxB bits stored on DIE B.

Multiplying matrix 60 by vector 64 produces an n-bit syndrome vector. The number of "1" bit values in the syndrome vector is the syndrome sum, i.e., the number of parity check equations that are not satisfied by the readout results. As explained above, the overall n-bit syndrome vector may not reflect the quality of the read thresholds of DIE A or DIE B.

In order to enable accurate threshold setting per die, matrix 60 is designed to provide high-quality die-specific syndrome sums. As can be seen in the figure, the matrix rows (and equivalently the parity check equations) are divided into three groups denoted G1, G2 and G3.

The equations in group G1 operate only on bits that are stored on DIE A. This property is achieved by defining a region 72B in the matrix that is all-zero. Similarly, the equations in group G3 operate only on bits that are stored on DIE B. This property is achieved by defining an all-zero region 72A in the matrix. In other words, the bits that appear in the equations of G1 are all read from DIE A, and the bits that appear in the equations of G3 are all read from DIE B. (The remaining equations, group G2, operate on bits read from both dies.) The remaining region 68 of matrix 60 comprises a (typically sparse) mixture of "1"s and "0"s.

In some embodiments, memory controller 40 calculates a die-specific syndrome sum for DIE A by multiplying only the rows of G1 by vector 64, and counting the number of "1"s in the multiplication result. Similarly, the memory controller may calculate a die-specific syndrome sum for DIE B by multiplying only the rows of G3 by vector 64, and counting the number of "1"s in the multiplication result.

By designing the parity check matrix with all-zero regions 72A and 72B, each of groups G1 and G3 comprises a large number of equations. Therefore, the die-specific syndrome sums are computed over a relatively large number of equations, and are therefore accurate.

The design of parity check matrix 60 (or equivalently the design of the ECC parity check equations) shown in FIG. 3 is an example design, which is chosen purely for the sake of conceptual clarity. In alternative embodiments, other suitable code designs can also be used. For example, the matrix rows may be divided only into groups G1 and G3, with no equations in G2. Although the structure of matrix 60 corresponds to two dies, this technique can be generalized in a straightforward manner to a larger number of dies.

Figure 4:
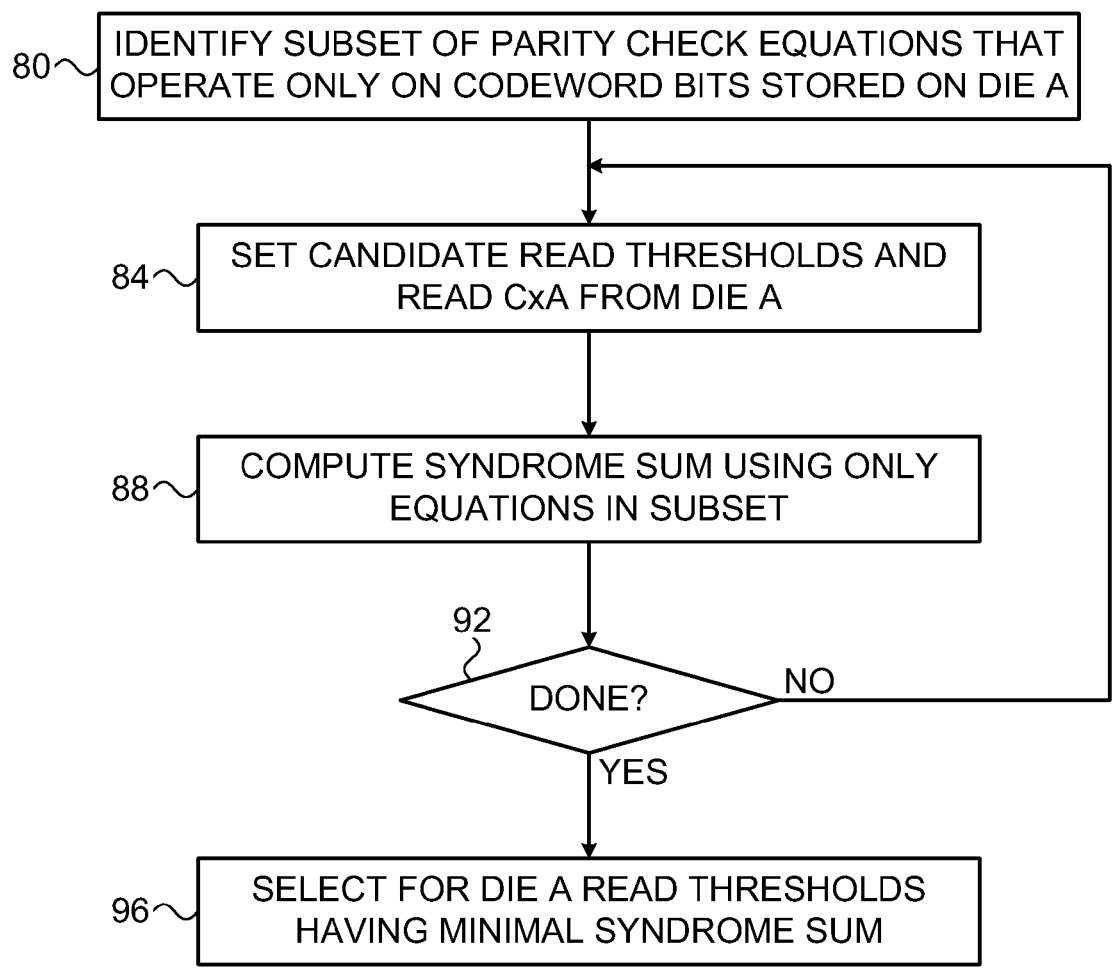
FIG. 4 is a flow chart that schematically illustrates a method for setting read thresholds, in accordance with an embodiment of the present invention.

FIG. 4 is a flow chart that schematically illustrates a method for setting read thresholds, in accordance with an embodiment of the present invention.

The method calculates the read thresholds for DIE A, in a configuration that stores each code word in two parts on DIE A and DIE B (e.g., the configuration of FIG. 2 above). The method begins with memory controller 40 identifying a subset of the parity check equations that operate only on bits read from DIE A (e.g., group G1 in FIG. 3), at a subset identification step 80.

The memory controller then begins a process of evaluating candidate read thresholds positions for DIE A. The memory controller sets certain candidate read thresholds for DIE A and reads the part CxA of a code word using these thresholds, at a readout step 84. The memory controller then computes the die-specific syndrome sum for DIE A based on the readout results, at a die-specific syndrome sum computation step 88. In this computation, the memory controller calculates the number of parity check equations in the subset (identified at step 80) that are not satisfied by the readout results (of step 84).

Memory controller 40 checks whether all desired candidate read threshold positions have been evaluated, at a termination checking step 92. If not, the method loops back to step 84 above in order to evaluate the next candidate. Otherwise, the memory controller selects the best-performing read thresholds based on the die-specific syndrome sums computed for the various candidates, at a threshold selection step 96.

In an example embodiment, the memory controller selects the read thresholds that produced the minimal syndrome sum. In other embodiments, the memory controller may select the read thresholds in any other suitable way, such as by interpolating between candidate read thresholds.

When carrying out the method of FIG. 4, the threshold estimation accuracy may be limited, because of the limited number of equations that participate in the die-specific syndrome sum calculation. In some embodiments, memory controller 40 improves the estimation accuracy by summing or averaging die-specific syndrome sums of multiple code words.

Referring to FIG. 2 above, for example, the memory controller may improve the read threshold accuracy for DIE A by calculating die-specific syndrome sums over C1A, C2A and C3A, and summing or averaging the results. In the example of FIG. 2, in a given die, each code word part is stored in a different word line. In alternative embodiments, multiple code word parts (e.g., C1A, C2A, C3A) are stored in the same word line and read using the same read thresholds.

In some embodiments, memory controller 40 may attempt to decode the ECC for only a part of a code word that is stored on a given die, using the subset of equations that operate on the bits stored on that die. For example, referring to the example of FIG. 3, the memory controller may attempt to decode the ECC for CxA stored on DIE A, using the subset of parity check matrices of group G1. Similarly, the memory controller may attempt to decode the ECC for CxB stored on DIE B, using the subset of parity check matrices of group G3.

This sort of decoding enables the memory controller to recover part of the data bits, without a need to access the other dies. On the other hand, the decoding performance of this decoding operation is degraded in comparison with full decoding of the entire code word.

Estimation of Other Readout Parameters

The description above focused on the setting of read thresholds based on the number of die-specific non-satisfied parity check equations. In alternative embodiments, the methods and systems described herein can be used to adjust or set various other sorts of readout parameters that are related to reading data from memory device 24.

For example, the memory controller may adjust cross-coupling coefficients, which are used for canceling cross-coupling interference in the storage values read from memory cells 32 in a given die, based on the die-specific syndrome sum. In some cases the storage values stored in memory cells 32 are distorted by cross-coupling interference from other memory cells. In some embodiments, memory controller 40 applies an interference cancellation process for canceling the cross-coupling interference in the storage values read from the memory cells. The memory controller may use any suitable interference cancellation method. Several examples of interference cancellation methods are described in PCT International Publications WO 2007/132453, WO 2007/132457 and WO 2008/026203, whose disclosures are incorporated herein by reference.

In some cross-coupling cancellation methods, the memory controller estimates the cross-coupling coefficients, i.e., the coupling ratios between memory cells, and then estimates and cancels the interference in a given cell based on the storage values of the other cells and on the estimated cross-coupling coefficients. As can be appreciated, accurate estimation of the cross-coupling coefficients is important for effectively cancelling the cross-coupling interference.

In particular, when the memory controller applies interference cancellation to a certain read code word prior to ECC decoding, the number of satisfied parity check equations may depend on the accuracy of the cross-coupling coefficients used in the cancellation process. Thus, the number of satisfied equations can be used as an indication of the accuracy of the cross-coupling coefficient. In some embodiments, memory controller 40 applies a process, similar to the method of FIG. 4 above, for adjusting the cross-coupling coefficient values of a die, based on the die-specific syndrome sum of that die. Typically, the process attempts to find the cross-coupling coefficient values that minimize the die-specific syndrome sum.

In some embodiments, the memory controller adjusts certain readout parameters that are related to the positions of the read thresholds, rather than adjusting the read thresholds directly. For example, when multiple read thresholds are used, the optimal position of each read threshold may shift over time in accordance with a certain known behavior. Different read thresholds may exhibit different shifts as a function of time. In such cases, the memory controller may regard the time that elapsed since the memory cells in a given die were programmed as a readout parameter, and track its value based on the die-specific syndrome sum. Once the elapsed time period is estimated, the different read thresholds can be positioned accordingly.

Yet another example of readout parameters that can be estimated based on the parity check equations involves estimating the statistical properties of noise that distorts the encoded bits read from a given die. When the noise can be assumed or approximated to be Gaussian, the estimated statistical property may comprise a variance or standard deviation of the noise. Estimates of the noise standard deviation is used, for example, as part of the LLR calculation in soft decoding of LDPC codes, as well as other types of ECC.

In some embodiments, memory controller 40 can estimate the Gaussian noise standard deviation by counting the die-specific number of unsatisfied equations. When a part of a code word is read from a given die using the optimal read threshold positions, the number of unsatisfied equations is indicative of the noise amplitude.

In some embodiments, the memory controller may hold a predefined look-up table that provides the noise variance (or standard deviation) as a function of the number of unsatisfied equations. During operation, the number of unsatisfied equations can be counted, and the noise standard deviation can be estimated by querying the lookup table. Alternatively, the memory controller may estimate any other suitable statistical property of the noise that distorts the read encoded bits based on the number of satisfied equations.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
in a memory that includes two or more memory units, storing a code word of an Error Correction Code (ECC) that is representable by a plurality of check equations, such that a first part of the code word is stored in a first memory unit and a second part of the code word is stored in a second memory unit, wherein the first memory unit and the second memory unit are located on different semiconductor dies;
identifying a subset of the check equations, which operate only on code word bits belonging to the first part stored in the first memory unit;
retrieving the first part of the code word from the first memory unit, and evaluating a count of the check equations in the subset that are not satisfied by the first part of the code word; and
setting one or more readout parameters for readout from the first memory unit depending on the count of the check equations.

2. The method according to claim 1, wherein setting the readout parameters comprises setting one or more read thresholds used for readout from the first memory unit.

3. The method according to claim 1, wherein a check matrix of the ECC comprises regions of all-zero elements that define the subset of the check equations.

4. The method according to claim 1, wherein evaluating the count of the check equations comprises computing the count over multiple first parts, which belong to multiple respective code words and are retrieved from the first memory unit.

5. The method according to claim 1, further comprising:
identifying a second subset of the check equations, which operate only on the code word bits belonging to the second part stored in the second memory unit;
retrieving the second part of the code word from the second memory unit, and evaluating a second count of the check equations in the second subset that are not satisfied by the retrieved second part of the code word; and
setting the readout parameters for the second memory unit, different from the readout parameters set for the first memory unit, depending on the second count.

6. The method according to claim 1, and comprising decoding the ECC over only the first part using the check equations in the subset.

7. The method according to claim 1, wherein the readout parameters comprises cross-coupling coefficients, and wherein setting the readout parameters comprises canceling, using the cross-coupling coefficients, cross-coupling interference among memory cells in the first memory unit that store the first part.

8. The method according to claim 1, wherein the readout parameters comprise a time that elapsed since the first part was stored in the first memory unit.

9. The method according to claim 1, wherein the readout parameters comprise a statistical property of a noise that distorts the first part retrieved from the first memory unit.

10. An apparatus comprising:
a memory comprising two or more memory units; and
storage circuitry, which is configured to store a code word of an Error Correction Code (ECC) that is representable by a plurality of check equations, such that a first part of the code word is stored in a first memory unit and a second part of the code word is stored in a second memory unit, wherein the first memory unit is located on a different semiconductor die than the second memory unit, to identify a subset of the check equations that operate only on code word bits belonging to the first part stored in the first memory unit, to retrieve the first part of the code word from the first memory unit, to evaluate a count of the check equations in the subset that are not satisfied by the first part of the code word, and to set one or more readout parameters for readout from the first memory unit depending on the evaluated count.

11. The apparatus according to claim 10, wherein the storage circuitry is configured to set the readout parameters by setting one or more read thresholds used for readout from the first memory unit.

12. The apparatus according to claim 10, wherein a check matrix of the ECC comprises regions of all-zero elements that define the subset of the check equations.

13. The apparatus according to claim 10, wherein the storage circuitry is configured to evaluate the count of the check equations by computing the count over multiple first parts, which belong to multiple respective code words and are retrieved from the first memory unit.

14. The apparatus according to claim 10, wherein the storage circuitry is configured to identify a second subset of the check equations that operate only on the code word bits belonging to the second part stored in the second memory unit, to retrieve the second part of the code word from the second memory unit, to evaluate a second count of the check equations in the second subset that are not satisfied by the second part of the code word, and to set the readout parameters for the second memory unit, different from the readout parameters set for the first memory unit, depending on the second count.

15. The apparatus according to claim 10, wherein the storage circuitry is configured to decode the ECC over only the first part using the check equations in the subset.

16. The apparatus according to claim 10, wherein the ECC comprises a Low Density Parity Check (LDPC) code.

17. The apparatus according to claim 10, wherein the ECC comprises a terminated convolutional code.

18. An apparatus comprising:
an interface, which is configured to communicate with a memory comprising two or more memory units; and
storage circuitry, which is configured to store a code word of an Error Correction Code (ECC) that is representable by a plurality of check equations, such that a first part of the code word is stored in a first memory unit and a second part of the code word is stored in a second memory unit, the first and second memory units being on different semiconductor dies, to identify a subset of the check equations that operate only on code word bits belonging to the first part stored in the first memory unit, to retrieve the first part of the code word from the first memory unit, to evaluate a count of the check equations in the subset that are not satisfied by the retrieved first part of the code word, and to set one or more readout parameters for readout from the first memory unit depending on the count.

* * * * *